United States Patent [19]
Wang et al.

[11] Patent Number: 6,020,269
[45] Date of Patent: Feb. 1, 2000

[54] ULTRA-THIN RESIST AND NITRIDE/OXIDE HARD MASK FOR METAL ETCH

[75] Inventors: Fei Wang, San Jose; Christopher F. Lyons, Fremont; Khanh B. Nguyen, San Mateo; Scott A. Bell, San Jose; Harry J. Levinson, Saratoga; Chih Yuh Yang, San Jose, all of Calif.

[73] Assignee: Advanced Micro Devices, Inc., Sunnyvale, Calif.

[21] Appl. No.: 09/203,461

[22] Filed: Dec. 2, 1998

[51] Int. Cl.[7] .................................................. H01L 21/302
[52] U.S. Cl. .......................... 438/717; 438/636; 438/736; 438/723; 438/724; 438/725; 438/720; 430/5
[58] Field of Search .................................. 430/5; 438/636, 438/717, 723, 724, 725, 736, 720, 742, 713, 744

[56] References Cited

U.S. PATENT DOCUMENTS

| | | | |
|---|---|---|---|
| 5,369,053 | 11/1994 | Fang | 437/194 |
| 5,876,903 | 3/1999 | Ng et al. | 430/313 |
| 5,930,634 | 7/1999 | Hause et al. | 438/307 |

*Primary Examiner*—Benjamin Utech
*Assistant Examiner*—George Goudreau
*Attorney, Agent, or Firm*—Renner, Otto, Boisselle & Sklar

[57] ABSTRACT

In one embodiment, the present invention relates to a method of forming a metal line, involving the steps of providing a semiconductor substrate comprising a metal layer, an oxide layer over the metal layer, and a silicon nitride layer over the oxide layer; depositing an ultra-thin photoresist over the silicon nitride layer, the ultra-thin photoresist having a thickness less than about 2,000 Å; irradiating the ultra-thin photoresist with electromagnetic radiation having a wavelength of about 250 nm or less; developing the ultra-thin photoresist exposing a portion of the silicon nitride layer; etching the exposed portion of the silicon nitride layer exposing a portion of the oxide layer; etching the exposed portion of the oxide layer exposing a portion of the metal layer; and etching the exposed portion of the metal layer thereby forming the metal line.

20 Claims, 4 Drawing Sheets

ULTRA-THIN RESIST AND NITRIDE/OXIDE HARD MASK FOR METAL ETCH

TECHNICAL FIELD

The present invention generally relates to etching metal using an ultra-thin resist. In particular, the present invention relates to etching extremely fine patterns in metal preferably using an extreme UV ultra-thin resist and a silicon nitride/oxide hard mask.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features, such as metal lines, with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 $\mu$m or less with acceptable resolution is difficult at best, and impossible in some circumstances. This is because photoresist layers used in lithography have thicknesses on the order of 7,000 Å and higher. Such relatively thick photoresist layers are not conducive to making small patterned dimensions with good resolution. In other words, critical dimension control for features having dimensions of about 0.25 $\mu$m or less is poor with relatively thick photoresist layers.

However, corner rounding problems and insufficient etch protection are associated with using thinner photoresists (less than 7,000 Å). In particular, corner rounding of layers underneath thin photoresists is caused by insufficient etch protection and results in poor definition/resolution. Improved lithography procedures providing improved resolution and improved critical dimension control are therefore desired.

SUMMARY OF THE INVENTION

The present invention generally provides methods that lead to improved critical dimension control in patterning metal lines. Since it is possible to patterning openings in ultra-thin photoresists on the order of about 0.1 $\mu$m or less, the present invention provides methods for forming hard masks with adequate stop capability for metal etching having improved resolution and to methods of forming metal lines of small width having improved resolution due to use of ultra-thin photoresists and hard masks having improved resolution. As a result, the present invention effectively addresses the concerns raised by the trend towards the miniaturization of semiconductor devices.

In one embodiment, the present invention relates to a method of forming a metal line, involving the steps of providing a semiconductor substrate comprising a metal layer, an oxide layer over the metal layer, and a silicon nitride layer over the oxide layer; depositing an ultra-thin photoresist over the silicon nitride layer, the ultra-thin photoresist having a thickness less than about 2,000 Å; irradiating the ultra-thin photoresist with electromagnetic radiation having a wavelength of about 250 nm or less; developing the ultra-thin photoresist exposing a portion of the silicon nitride layer; etching the exposed portion of the silicon nitride layer exposing a portion of the oxide layer; etching the exposed portion of the oxide layer exposing a portion of the metal layer; and etching the exposed portion of the metal layer thereby forming the metal line.

In another embodiment, the present invention relates to a method of etching metal to form metal lines, involving the steps of providing a semiconductor substrate comprising a metal layer, an oxide layer over the metal layer, and a silicon nitride layer over the oxide layer; depositing an ultra-thin photoresist over the silicon nitride layer, the ultra-thin photoresist having a thickness from about 500 Å to about 2,000 Å; irradiating the ultra-thin photoresist with electromagnetic radiation having a wavelength of about 200 nm or less; developing the ultra-thin photoresist exposing a portion of the silicon nitride layer, wherein the exposed portion of the silicon nitride layer has a width of about 0.1 $\mu$m or less; etching the exposed portion of the silicon nitride layer exposing a portion of the oxide layer; etching the exposed portion of the oxide layer exposing a portion of the metal layer; and etching the exposed portion of the metal layer thereby forming metal lines.

In yet another embodiment, the present invention relates to a method of processing a semiconductor substrate, involving the steps of providing a semiconductor substrate comprising a metal layer, an oxide layer over the metal layer, and a silicon nitride layer over the oxide layer, wherein the metal layer comprises aluminum; depositing an ultra-thin photoresist over the silicon nitride layer, the ultra-thin photoresist having a thickness from about 500 Å to about 2,000 Å; irradiating the ultra-thin photoresist with electromagnetic radiation having a wavelength of about 200 nm or less; developing the ultra-thin photoresist exposing a portion of the silicon nitride layer; etching the exposed portion of the silicon nitride layer exposing a portion of the oxide layer; etching the exposed portion of the oxide layer exposing a portion of the metal layer; and etching the exposed portion of the metal layer thereby forming a metal line having a width of about 0.1 $\mu$m or less.

DISCLOSURE OF THE INVENTION

The present invention involves etching extremely fine patterns in metal using an ultra-thin resist and a silicon nitride/oxide hard mask. The present invention more specifically involves using an ultra-thin resist sensitive to radiation of short wavelength which enable high resolution patterning of silicon nitride layers and oxide layers, which, in turn, are used as hard masks for etching metal layers having features on the order of about 0.1 μm or less, and even about 0.05 μm or less. The silicon nitride layer and the oxide layer constitute a dual hard mask which facilitates the use of ultra-thin resists. The dual hard mask minimizes corner rounding problems and insufficient etch protection commonly associated with thin resists. Although it is possible to pattern features with dimensions on the order of about 0.1 μm or less, it is also possible to pattern features with dimensions on the order of about 0.2 μm or less and 0.15 μm or less in accordance with the invention.

Figure 1:
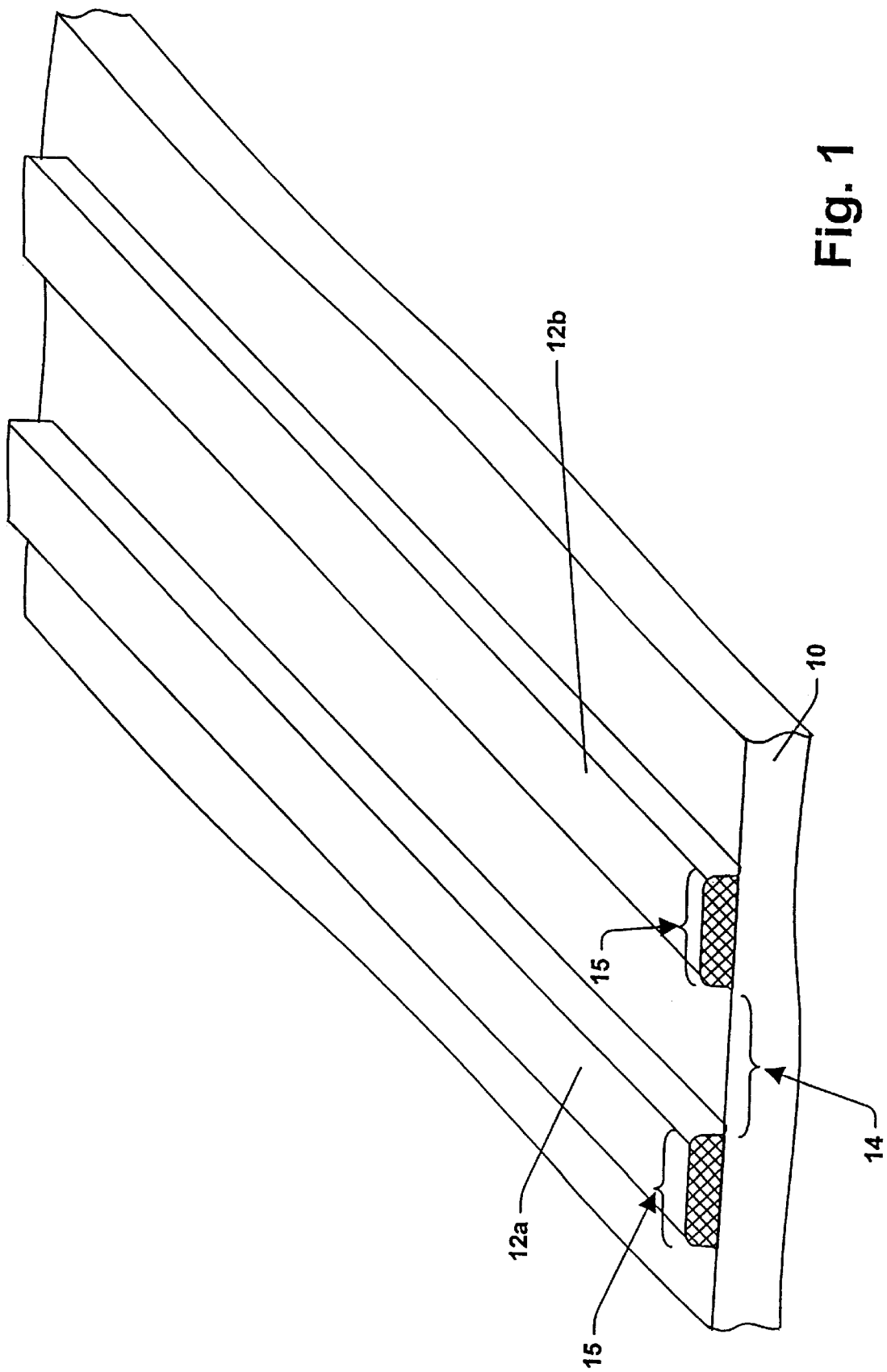
FIG. 1 illustrates in a cross-sectional view of metal lines made according to one aspect of the present invention.

Referring to FIG. 1, as a result of the present invention, it is possible to provide metal lines 12a and 12b of small dimensions having good resolution over a semiconductor substrate 10. In one embodiment of the invention, it is possible to provide metal lines wherein the distance or spacing 14 between metal lines 12a and 12b is about 1,000 Å or less. In another embodiment of the invention, it is possible to provide metal lines wherein the width 15 of a metal line, such as metal line 12a, is about 1,000 Å or less, or even about 500 Å or less.

FIGS. 2–7 illustrate a method in connection with forming metal lines that provide electrical contact between two features on a semiconductor substrate 10. The method of FIGS. 2–7 may be adapted to making electrical contacts between various device structures, active elements and passive elements including polysilicon gates, word lines, source regions, drain regions, bit lines, bases, emitters, collectors, conductive lines, conductive plugs, etc. The method of FIGS. 2–7 may be used with any suitable semiconductor technology including but not limited to NMOS, PMOS, CMOS, BiCMOS, bipolar, multi-chip modules (MCM) and III–IV semiconductors.

Figure 2:
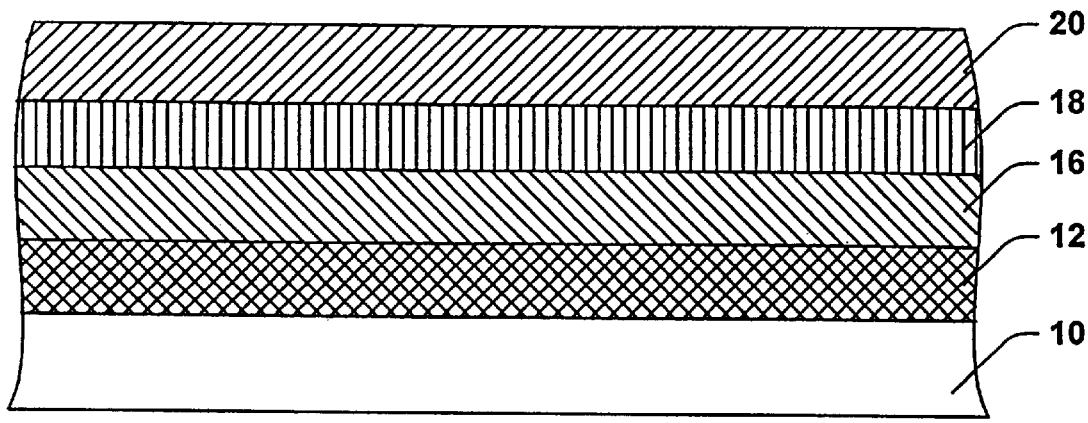
FIG. 2 illustrates in a cross-sectional view the methods according to one aspect of the present invention.

Referring to FIG. 2, a semiconductor substrate 10 having a metal layer 12 thereover is provided. Semiconductor substrate 10 may include any suitable semiconductor material (one or more layers of semiconductor materials), for example, a monocrystalline silicon substrate. Semiconductor substrate 10 may include of one or more layers including substrate layers, diffusion regions, dielectric layers such as oxides and nitrides, devices, polysilicon layers, and the like. Although shown as continuous, the metal layer 12 may be continuous or intermittent. That is, metal layer 12 may cover all or portion of semiconductor substrate 10.

In one embodiment, the metal layer is a conductive metal layer. In another embodiment, the metal layer contains two metal layers; for example, a conductive metal layer and a barrier metal layer. Metal layers include layers of a single metal as well as metal alloy layers containing two or more metals. Specific examples of underlying layers include aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, and any other alloys thereof. The metal layer is deposited over the semiconductor substrate 10 using any suitable technique including sputtering, and the like.

The metal layer 12 has a thickness suitable for forming a metal line. In one embodiment, the metal layer has a thickness from about 1,000 Å to about 20,000 Å. In another embodiment, the metal layer has a thickness from about 2500 Å to about 10,000 Å. In yet another embodiment, the metal layer has a thickness from about 5,000 Å to about 10,000 Å.

An oxide layer 16 is formed over the metal layer 12. Although typically silicon dioxide, oxide layer 16 may include any suitable dielectric oxide material or materials, including silicon dioxide, fluorine doped silicon glass FSG), tetraethylorthosilicate (TEOS), phosphosilicate glass (PSG), borophosphosilicate glass (BPSG), any suitable spin-on glass, or low k polymer materials. Although low k polymer materials are not normally covered by the term oxide, for purposes of the present invention the oxide layer may cover and thus contain low k polymer materials as a dielectric oxide material. Low k polymer materials include polyimides, fluorinated polyimides, polysilsequioxane, benzocyclobutene (BCB), parlene F, parlene N and amorphous polytetrafluoroethylene. A specific example of a commercially available low k polymer material is Flare™ from AlliedSignal believed to be derived from perfluorobiphenyl and aromatic bisphenols.

Oxide layer 16 may be formed to any suitable thickness using any suitable technique that may depend, for instance, on the material or materials used. For example, in the case of silicon dioxide, FSG, TEOS, PSG, and BPSG, chemical vapor deposition (CVD) techniques, such as high density plasma chemical vapor deposition (HDP-CVD), low pressure chemical vapor deposition (LPCVD) or plasma enhanced chemical vapor deposition (PECVD), are useful. Alternatively, silicon may be sputtered in an atmosphere containing oxygen or grown using thermal oxidation techniques. In embodiments where the oxide is a glass, spin-on techniques may be employed.

The oxide layer 16 has a thickness suitable for insulating a metal line and/or functioning as a hard mask for etching the underlying metal layer. In one embodiment, the oxide layer has a thickness from about 5,000 Å to about 10,000 Å. In another embodiment, the oxide layer has a thickness from about 1,500 Å to about 9,000 Å. In yet another embodiment, the oxide layer has a thickness from about 2,000 Å to about 5,000 Å.

A silicon nitride layer 18 is formed over the oxide layer 16. The silicon nitride layer can be formed using any suitable technique including CVD techniques, such as LPCVD or PECVD. In one embodiment, the silicon nitride is made using a one step PECVD or LPCVD technique such as simultaneously employing gases containing silicon and nitrogen, such as using $SiH_4$ or $SiCl_2H_2$ and $N_2$ or $NH_3$. In this embodiment, the silicon nitride layer is made using LPCVD techniques ($SiCl_2H_2$ and $NH_3$) and contains $Si_3N_4$. Although termed silicon nitride herein, the silicon nitride layer formed in accordance with the present invention may additionally contain hydrogen, especially in embodiments where the silicon nitride layer is made using PECVD techniques, and thus may also be characterized by the chemical formula $Si_xN_yH_z$.

The silicon nitride layer 18 has a thickness suitable for functioning as a hard mask for etching the underlying oxide layer. The silicon nitride layer has a thickness from about 500 Å to about 5,000 Å. In another embodiment, the silicon nitride layer has a thickness from about 1,000 Å to about 4,000 Å. In yet another embodiment, the silicon nitride layer has a thickness from about 1,500 Å to about 3,000 Å.

An ultra-thin photoresist layer 20 is then formed over the silicon nitride layer 18. The ultra-thin photoresist 20 is deposited over the silicon nitride layer 18 using any suitable technique. For example, the ultra-thin photoresist 20 is deposited using conventional spin-coating or spin casting techniques.

Ultra-thin photoresists in accordance with the present invention have a thickness of about 2,000 Å or less. In one embodiment, the ultra-thin photoresist layer has a thickness from about 500 Å to about 2,000 Å. In another embodiment, the ultra-thin photoresist layer has a thickness from about 600 Å to about 1,750 Å (about 1,750 Å or less). In yet another embodiment, the ultra-thin photoresist layer has a thickness from about 750 Å to about 1,500 Å (about 1,500 Å or less).

The ultra-thin photoresist layer 20 has a thickness suitable for functioning as a mask for etching the underlying silicon nitride layer 18 and for forming patterns or openings in the developed ultra-thin photoresist layer that are about 0.1 μm or less, and even 0.05 μm or less. Since the ultra-thin photoresist layer 20 is relatively thin compared with I-line and other photoresists, improved critical dimension control is realized.

Ultra-thin resists are processed using small wavelength radiation. As used herein, small wavelength radiation means electromagnetic radiation having a wavelength of about 250 nm or less. In one embodiment, small wavelength radiation includes electromagnetic radiation having a wavelength of about 200 nm or less. In another embodiment, small wavelength radiation includes extreme UV electromagnetic radiation having a wavelength of about 25 nm or less. In yet another embodiment, small wavelength radiation includes extreme UV electromagnetic radiation having a wavelength of about 15 nm or less.

Small wavelength radiation increases precision and thus the ability to improve critical dimension control. Specific examples of wavelengths to which the ultra-thin photoresists are sensitive (undergo chemical transformation enabling subsequent development) include about 248 nm, about 193 nm, about 157 nm, about 13 nm, about 11 nm and about 1 nm. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, extreme UV light having wavelengths of about 13.4 nm and about 11.5 nm, and X-rays having a wavelength of about 1 nm.

In embodiments where the patterns or openings formed in the developed ultra-thin photoresist layer are from about 0.1 μm to about 0.15 μm, a 157 nm sensitive photoresist or a 193 nm sensitive photoresist is preferably employed. In embodiments where the patterns or openings formed in the developed ultra-thin photoresist layer are about 0.1 μm or less, a 13 nm sensitive photoresist or an 11 nm sensitive photoresist (extreme UV photoresist) is preferably employed.

Positive or negative ultra-thin photoresists may be employed in the methods of the present invention. An example of a deep UV chemically amplified photoresist is a partially t-butoxycarbonyloxy substituted poly-p-hydroxystyrene. Photoresists are commercially available from a number of sources, including Shipley Company, Kodak, Hoechst Celanese Corporation, Brewer and IBM.

Figure 3:
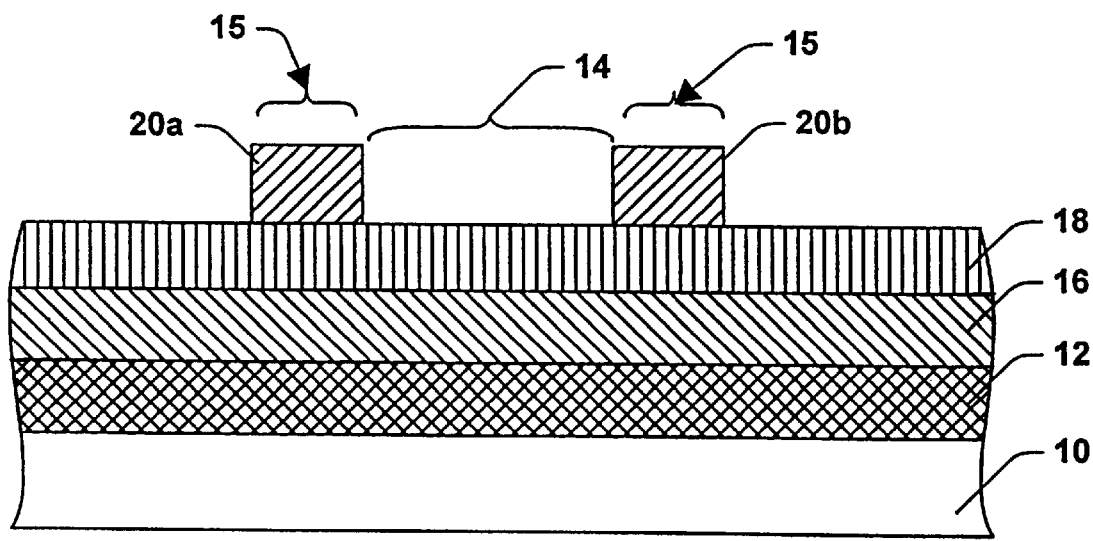
FIG. 3 illustrates in a cross-sectional view the methods according to one aspect of the present invention.

Referring to FIG. 3, the ultra-thin photoresist layer 20 is then exposed to radiation and developed to provide a patterned photoresist 20a and 20b. The patterned photoresist 20a and 20b is formed using electromagnetic radiation having a relatively small wavelength (for example, less than 250 nm). In this embodiment, electromagnetic radiation having a wavelength of about 13 nm is employed. Since relatively small wavelengths are used, reflectivity concerns are minimized because larger wavelengths are more frequently associated with reflectivity problems. The ultra-thin photoresist layer 20 is selectively exposed to radiation; that is, selected portions of the ultra-thin photoresist layer 20 are exposed to radiation. Either the exposed or unexposed portions of the ultra-thin photoresist layer 20 are removed or developed to provide the patterned photoresist 20a and 20b.

The size of the cross-section of the exposed portion of the silicon nitride layer 18 (opening 14 in the patterned photoresist 20a and 20b) is about 0.1 μm or less, including about 0.09 μm or less, about 0.075 μm or less and about 0.05 μm or less, depending upon the wavelength of radiation employed. Similarly, the cross-section of a portion of the patterned photoresist 20a and 20b, for example the width of 20a, is about 0.1 μm or less, including about 0.09 μm or less, about 0.075 μm or less and about 0.05 μm or less.

The selectively exposed ultra-thin photoresist layer 20 is developed by contact with a suitable developer that removes either the exposed or unexposed portions of the ultra-thin photoresist layer 20. The identity of the developer depends upon the specific chemical constitution of the ultra-thin photoresist layer 20. For example, an aqueous alkaline solution may be employed to remove unexposed portions of the ultra-thin photoresist layer 20. Alternatively, one or more of dilute aqueous acid solutions, hydroxide solutions, water, and organic solvent solutions may be employed to remove selected portions of the ultra-thin photoresist layer 20. The developer is selected so that it does not degrade or etch the material of the silicon nitride layer 18, or at least degrades or etches the material of the silicon nitride layer 18 at a relatively smaller rate as compared to the rate that the material of the ultra-thin photoresist layer 20 is developed. In other words, the silicon nitride layer 18 serves as an etch-stop layer when developing the ultra-thin photoresist layer 20.

The patterned photoresist 20a and 20b may assume any suitable pattern, but typically the patterned photoresist corresponds to the subsequent patterned metal layer. In a preferred embodiment, the patterned photoresist 20a and 20b constitutes one or more lines. The patterned photoresist 20a and 20b defines one or more openings over the silicon nitride layer 18. The patterned photoresist 20a and 20b serves as an etch mask layer for processing or etching the underlying silicon nitride layer 18.

Figure 4:
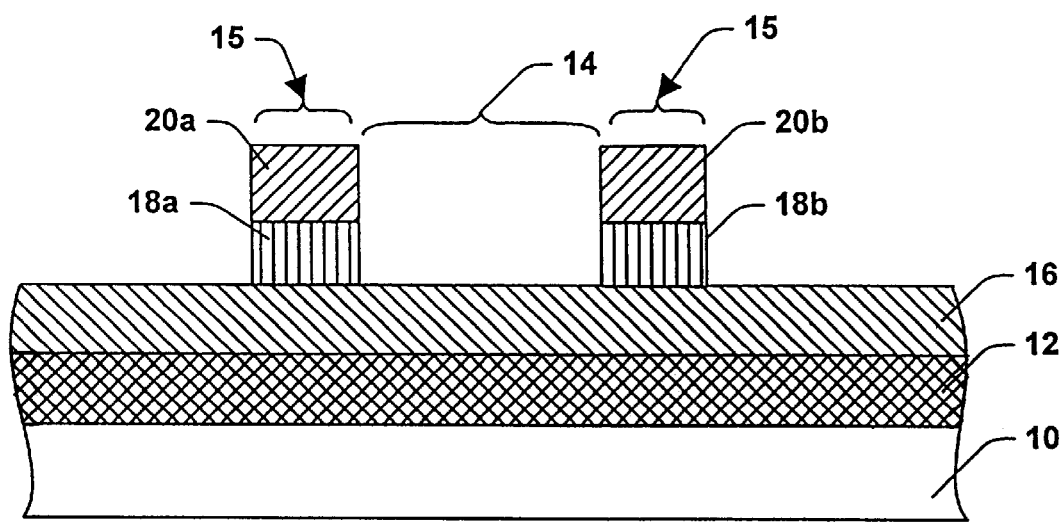
FIG. 4 illustrates in a cross-sectional view the methods according to one aspect of the present invention.

Referring to FIG. 4, the patterned photoresist 20a and 20b is used as a mask for selectively etching the silicon nitride layer 18 to provide patterned silicon nitride layer 18. Any suitable etch technique may be used to etch silicon nitride layer 18. Preferably, a selective etch technique may be used to etch the material of the silicon nitride layer 18 at a relatively greater rate as compared to the rates that the material of the patterned photoresist 20a and 20b and the oxide layer 16 are etched. In other words, the oxide layer 16 serves as an etch-stop layer when etching the silicon nitride layer 18.

In a preferred embodiment, the silicon nitride layer 18 is etched using an anisotropic etching process. Dry or wet etching techniques may be employed. Dry etching techniques are preferred. Dry etch techniques involve using fluorochemistry, such as one of $NF_3$, $BF_3$, $SF_6$, $CH_3F$, $CF_4$ and $CHF_3$, may be employed. In a preferred embodiment, reactive ion etching is employed. In another preferred embodiment, an oxygen containing gas such as $O_2$ is employed with the fluorine compound.

A selective silicon nitride:photoresist etch technique may be used to etch silicon nitride layer 18 to provide patterned silicon nitride layer 18a and 18b and continue to define opening 14 exposing portions of the oxide layer 16. In one embodiment, the silicon nitride:photoresist etch selectivity is at least about 3:1. In another embodiment, the silicon nitride:photoresist etch selectivity is at least about 4:1.

The size of the cross-section of opening 14 continues to remain the same or substantially the same as defined in connection with exposing portions of the silicon nitride layer 18. This etch technique has selectivity to etch silicon nitride from exposed portions of silicon nitride layer 18, such as in opening 14, without significantly etching patterned photoresist 20a and 20b or oxide layer 16. Patterned photoresist 20a and 20b is then optionally removed from the substrate. In one embodiment, the patterned photoresist 20a and 20b is removed prior to etching the oxide layer 16. In another embodiment, the patterned photoresist 20a and 20b is not removed prior to etching the oxide layer 16. The substrate may be optionally cleaned to remove residue from opening 14.

The patterned silicon nitride layer 18a and 18b may assume any suitable pattern, but typically the patterned silicon nitride layer 18a and 18b corresponds or substantially corresponds to the patterned photoresist 20a and 20b. The patterned silicon nitride layer 18a and 18b defines one or more openings over the oxide layer 16. The patterned silicon nitride layer 18a and 18b serves as an etch hard mask layer for processing or etching the underlying oxide layer 16 and/or as part of a hard mask for etching the underlying metal layer 12.

Figure 5:
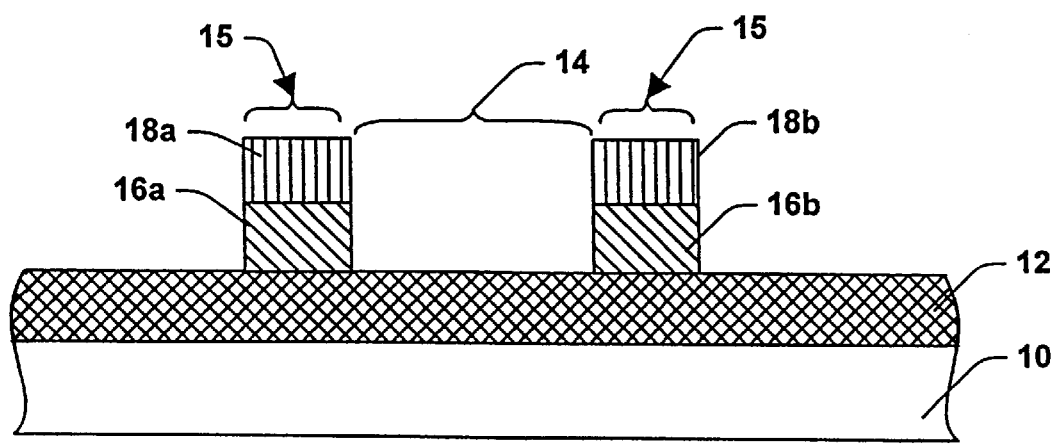
FIG. 5 illustrates in a cross-sectional view the methods according to one aspect of the present invention.

Referring to FIG. 5, the patterned silicon nitride layer 18a and 18b is used as a mask for selectively etching the oxide layer 16 to provide patterned oxide layer 16a and 16b. Any suitable etch technique may be used to etch oxide layer 16. Preferably, a selective etch technique may be used to etch the material of the oxide layer 16 at a relatively greater rate as compared to the rates that the material of the patterned silicon nitride layer 18a and 18b and the metal layer 12 are etched. In other words, the metal layer 12 serves as an etch-stop layer when etching the oxide layer 16.

In a preferred embodiment, the oxide layer 16 is etched using an anisotropic etching process. Dry or wet etching techniques may be employed. Wet etch techniques involve using buffered HF. Dry etch techniques involve using fluorocarbons such as one of $SF_6$, $NF_3$, $CF_4$, $C_2F_6$, CO, $C_4F_8$ and $CHF_3$ optionally with $H_2$ or $O_2$. In an embodiment where the oxide layer 16 contains BPSG, a dry etch using Ar and one of $CF_4$ and $CHF_3$ may be employed. In a preferred embodiment, reactive ion etching is employed. In a preferred embodiment, the etch techniques employed are different from the etch techniques employed for the silicon nitride layer 18 in at least one of the chemistry involved or type of etching technique.

A selective oxide:silicon nitride etch technique may be used to etch oxide layer 16 to provide patterned oxide layer 16a and 16b and continue to define opening 14 exposing portions of the metal layer 12. In one embodiment, the oxide:silicon nitride etch selectivity is at least about 5:1. In another embodiment, the oxide:silicon nitride etch selectivity is at least about 6:1.

The size of the cross-section of opening 14 continues to remain the same or substantially the same as defined in connection with exposing portions of the oxide layer 16. This etch technique has selectivity to etch oxide from exposed portions of the oxide layer 16, such as in opening 14, without significantly etching the patterned silicon nitride layer 18a and 18b or metal layer 12. Patterned photoresist 20a and 20b (not shown), if still present, and/or patterned silicon nitride layer 18a and 18b are then optionally removed from the substrate. In one embodiment, the patterned silicon nitride layer 18a and 18b is removed prior to etching the metal layer 12. In another embodiment, the patterned silicon nitride layer 18a and 18b is not removed prior to etching the metal layer 12. The substrate may be optionally cleaned to remove residue from opening 14.

The patterned oxide layer 16a and 16b may assume any suitable pattern, but typically the patterned oxide layer 16a and 16b corresponds or substantially corresponds to the patterned silicon nitride layer 18a and 18b. The patterned oxide layer 16a and 16b defines one or more openings over the metal layer 12. The patterned oxide layer 16a and 16b serves as an etch hard mask layer for processing or etching the underlying metal layer 12 and/or as part of a hard mask in combination with the patterned silicon nitride layer 18a and 18b for etching the underlying metal layer 12.

Figure 6:
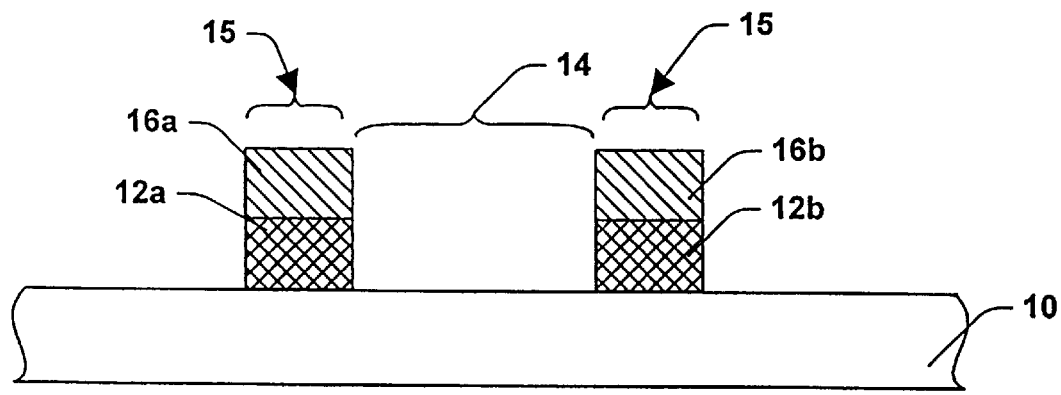
FIG. 6 illustrates in a cross-sectional view the methods according to one aspect of the present invention.

Referring to FIG. 6, the patterned oxide layer 16a and 16b is used as a mask for selectively etching the metal layer 12 to provide patterned metal layer 12a and 12b. Any suitable etch technique may be used to etch metal layer 12. Preferably, a selective etch technique may be used to etch the metal of the metal layer 12 at a relatively greater rate as compared to the rates that the material of the patterned oxide layer 16a and 16b and the semiconductor substrate 10 are etched.

In a preferred embodiment, the metal layer 12 is etched using an anisotropic etching process. Dry or wet etching techniques may be employed. Wet etching involves contact with acid solutions at elevated temperatures. For example, solutions of phosphoric acid, nitric acid, acetic acid at temperatures from about 30° C. to about 50° C. may be employed. Dry etch techniques involve using chlorine based materials such as one or more of $CCl_4$, $BCl_3$, $SiCl_4$ and $Cl_2$.

A selective metal:oxide etch technique may be used to etch metal layer 12 to provide patterned metal layer 12a and 12b and continue to define opening 14 exposing portions of the semiconductor substrate 10. In one embodiment, the metal:oxide etch selectivity is at least about 3:1. In another embodiment, the metal:oxide etch selectivity is at least about 4:1.

The size of the cross-section of opening 14 continues to remain the same or substantially the same as defined in connection with exposing portions of the metal layer 12. This etch technique has selectivity to etch metal from exposed portions of the metal layer 12, such as in opening 14, without significantly etching the patterned oxide layer 12a and 12b or semiconductor substrate 10.

Figure 7:
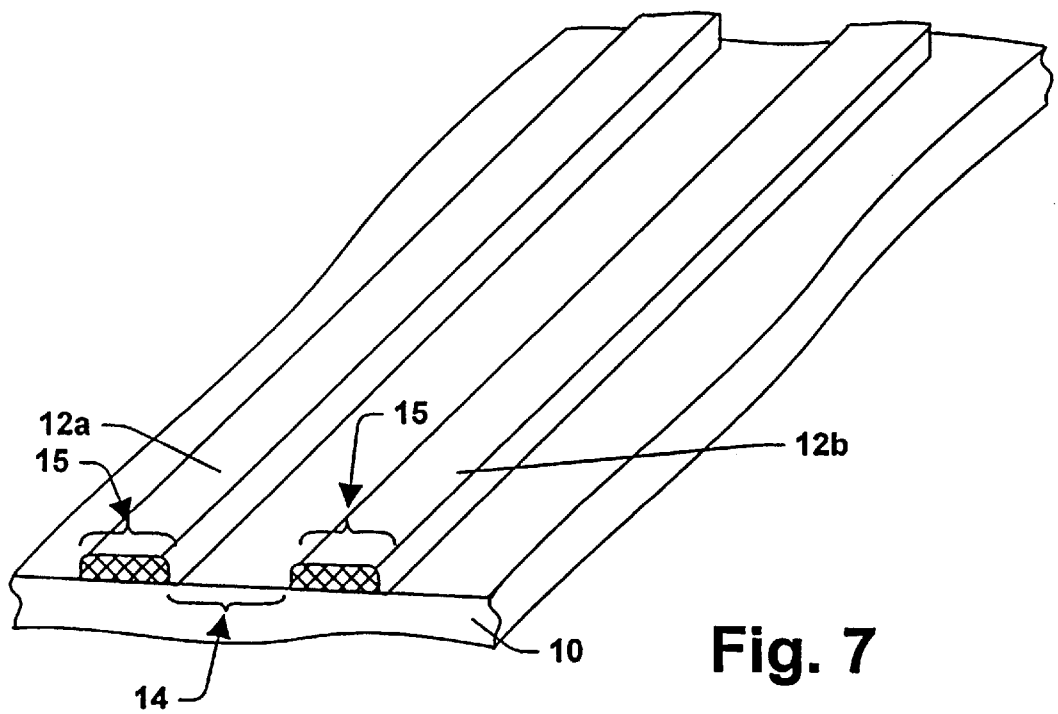
FIG. 7 illustrates in a cross-sectional view the methods according to one aspect of the present invention.

Referring to FIG. 7, the patterned photoresist 20a and 20b (not shown), if still present, the patterned silicon nitride layer 18a and 18b (not shown), if still present, and the patterned oxide layer 16a and 16b (not shown) are then stripped or removed from the substrate. The patterned metal layer 12a and 12b may assume any suitable pattern, but typically the patterned metal layer 12a and 12b is in the form of conductive lines. The substrate may be optionally cleaned to remove residue from opening 14 before further processing is conducted.

In embodiments where the patterned silicon nitride layer 18a and 18b and the patterned oxide layer 16a and 16b remain on the semiconductor substrate 10, the patterned silicon nitride layer 18a and 18b may serve as an oxide chemical mechanical polishing (CMP) stop layer. This is particularly advantageous because deposition of a separate CMP stop layer is not necessary when an oxide layer is deposited over the patterned silicon nitride layer 18a and 18b during subsequent processing.

As a result of the present invention, improved critical dimension control is achieved as the dimensions of the patterns and/or various openings in the patterned photoresist 20a and 20b, patterned silicon nitride layer 18a and 18b, patterned oxide layer 16a and 16b are small, controllable, crisp and of high quality. Patterned metal lines of small dimension (widths of about 0.1 $\mu$m or less) and two or more patterned metal lines separated by small dimensions (spacing between lines of about 0.1 $\mu$m or less) can be obtained using the methods of the present invention. In another embodiment, patterned metal lines of small dimension (widths of about 0.09 $\mu$m or less) and two or more patterned metal lines separated by small dimensions (spacing between lines of about 0.09 $\mu$m or less) can be obtained using the methods of the present invention. In yet another embodiment, patterned metal lines of small dimension (widths of about 0.075 $\mu$m or less) and two or more patterned metal lines separated by small dimensions (spacing between lines of about 0.075 $\mu$m or less) can be obtained using the methods of the present invention. In still yet another embodiment, patterned metal lines of small dimension (widths of about 0.05 $\mu$m or less) and two or more patterned metal lines separated by small dimensions (spacing between lines of about 0.05 $\mu$m or less) can be obtained using the methods of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a metal line, comprising:

providing a semiconductor substrate comprising a metal layer, an oxide layer over the metal layer, and a silicon nitride layer over the oxide layer;

depositing an ultra-thin photoresist over the silicon nitride layer, the ultra-thin photoresist having a thickness less than about 2,000 Å;

irradiating the ultra-thin photoresist with electromagnetic radiation having a wavelength of about 250 nm or less;

developing the ultra-thin photoresist exposing a portion of the silicon nitride layer;

etching the exposed portion of the silicon nitride layer exposing a portion of the oxide layer;

etching the exposed portion of the oxide layer exposing a portion of the metal layer; and etching the exposed portion of the metal layer thereby forming the metal line.

2. The method of claim 1, wherein the metal layer comprises at least one of aluminum, copper, aluminum-copper alloys, aluminum alloys, and copper alloys.

3. The method of claim 1, wherein the oxide layer comprises at least one of silicon dioxide, fluorine doped silicon glass, tetraethylorthosilicate, phosphosilicate glass, and borophosphosilicate glass.

4. The method of claim 1, wherein the metal layer has a thickness from about 1,000 Å to about 20,000 Å, the oxide layer has a thickness from about 1,000 Å to about 10,000 Å, and the silicon nitride layer has a thickness from about 500 Å to about 5,000 Å.

5. The method of claim 1, wherein the electromagnetic radiation has a wavelength of about 13 nm or about 11 nm.

6. The method of claim 1, wherein the silicon nitride layer comprises $Si_3N_4$.

7. The method of claim 1, wherein the metal line has a width of about 0.1 $\mu$m or less.

8. A method of etching metal to form metal lines, comprising:

providing a semiconductor substrate comprising a metal layer, an oxide layer over the metal layer, and a silicon nitride layer over the oxide layer;

depositing an ultra-thin photoresist over the silicon nitride layer, the ultra-thin photoresist having a thickness from about 500 Å to about 2,000 Å;

irradiating the ultra-thin photoresist with electromagnetic radiation having a wavelength of about 200 nm or less;

developing the ultra-thin photoresist exposing a portion of the silicon nitride layer, wherein the exposed portion of the silicon nitride layer has a width of about 0.1 $\mu$m or less;

etching the exposed portion of the silicon nitride layer exposing a portion of the oxide layer;

etching the exposed portion of the oxide layer exposing a portion of the metal layer; and etching the exposed portion of the metal layer thereby forming metal lines.

9. The method of claim 8, wherein the ultra-thin photoresist has a thickness from about 600 Å to about 1,750 Å.

10. The method of claim 8, wherein the oxide layer comprises at least one of silicon dioxide, fluorine doped silicon glass, tetraethylorthosilicate, phosphosilicate glass, and borophosphosilicate glass.

11. The method of claim 8, wherein the electromagnetic radiation has a wavelength of about 13 nm or about 11 nm.

12. The method of claim 8, wherein the metal layer has a thickness from about 2,500 Å to about 15,000 Å, the oxide layer has a thickness from about 1,500 Å to about 9,000 Å, and the silicon nitride layer has a thickness from about 1,000 Å to about 4,000 Å.

13. The method of claim 8, wherein etching the exposed portion of the silicon nitride layer comprises using a silicon nitride:photoresist etch selectivity of at least about 3:1.

14. The method of claim 8, wherein etching the exposed portion of the oxide layer comprises using an oxide:silicon nitride etch selectivity of at least about 5:1.

15. A method of processing a semiconductor substrate, comprising:

provide a semiconductor substrate comprising a metal layer, an oxide layer over the metal layer, and a silicon nitride layer over the oxide layer, wherein the metal layer comprises aluminum;

depositing an ultra-thin photoresist over the silicon nitride layer, the ultra-thin photoresist having a thickness from about 500 Å to about 2,000 Å;

irradiating the ultra-thin photoresist with electromagnetic radiation having a wavelength of about 200 nm or less;

developing the ultra-thin photoresist exposing a portion of the silicon nitride layer;

etching the exposed portion of the silicon nitride layer exposing a portion of the oxide layer;

etching the exposed portion of the oxide layer exposing a portion of the metal layer; and etching the exposed portion of the metal layer thereby forming a metal line having a width of about 0.1 μm or less.

16. The method of claim 15, wherein the electromagnetic radiation has a wavelength of about 13 nm or about 11 nm.

17. The method of claim 15, wherein the metal layer has a thickness from about 5,000 Å to about 10,000 Å, the oxide layer has a thickness from about 2,000 Å to about 5,000 Å, and the silicon nitride layer has a thickness from about 1,500 Å to about 3,000 Å.

18. The method of claim 15, wherein etching the exposed portion of the silicon nitride layer comprises using a silicon nitride:photoresist etch selectivity of at least about 4:1.

19. The method of claim 15, wherein etching the exposed portion of the oxide layer comprises using an oxide:silicon nitride etch selectivity of at least about 6:1.

20. The method of claim 15, wherein etching the exposed portion of the metal layer comprises using a metal:oxide etch selectivity of at least about 3:1.

\* \* \* \* \*

UNITED STATES PATENT AND TRADEMARK OFFICE
CERTIFICATE OF CORRECTION

PATENT NO : 6,020,269
DATED : February 1, 2000
INVENTOR(S) : Fei Wang et al.

It is certified that error appears in the above-identified patent and that said Letters Patent is hereby corrected as shown below:

Col. 1, line 19
  replace "comers"
  with --corners--.
Col. 1, line 58
  replace "comer"
  with --corner--.

Signed and Sealed this

Fourteenth Day of November, 2000

Attest:

Q. TODD DICKINSON

Attesting Officer

Director of Patents and Trademarks